(12) United States Patent
Demange et al.

(10) Patent No.: US 6,795,330 B2
(45) Date of Patent: Sep. 21, 2004

(54) METHOD OF READING AND RESTORING DATA STORED IN A FERROELECTRIC MEMORY CELL

(75) Inventors: Nicolas Demange, Cannizzaro (IT); Salvatore Torrisi, Catania (IT); Giampiero Sberno, Catania (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 10/226,642

(22) Filed: Aug. 23, 2002

(65) Prior Publication Data

US 2003/0058702 A1 Mar. 27, 2003

(30) Foreign Application Priority Data

Aug. 24, 2001 (IT) ........................................ MI2001A1812

(51) Int. Cl.$^7$ .............................................. G11C 11/22
(52) U.S. Cl. ................................. 365/145; 365/189.04
(58) Field of Search ........................... 365/145, 189.04, 365/190, 203, 210

(56) References Cited

U.S. PATENT DOCUMENTS 5,262,982 A * 11/1993 Brassington et al. ....... 365/145
5,592,410 A * 1/1997 Verhaeghe et al. ......... 365/145
5,835,400 A * 11/1998 Jeon et al. .................. 365/145

* cited by examiner

*Primary Examiner*—Thong Le
(74) *Attorney, Agent, or Firm*—Lisa K. Jorgenson; Bryan A. Santarelli; Graybeal Jackson Haley LLP

(57) ABSTRACT

A method of reading and restoring data stored in a ferroelectric memory cell is disclosed. The cell includes a first transistor and first ferroelectric capacitor connected, in series with each other, between a first bitline and an auxiliary line, a second transistor and second ferroelectric capacitor connected, in series with each other, between a second bitline and the auxiliary line, the first and second transistors having respective control terminals connected to a common wordline. The reading method includes precharging the first and second capacitors, applying a read pulse to the cell such that the state of the first capacitor is changed, reading the cell by a sensing means, and restoring the first capacitor to an initial state. Advantageously, the reading method further includes changing the state of the second capacitor during the step of restoring the first capacitor, and further restoring the second capacitor to an initial state, such that the voltages being applied to the transistors during any of the steps are lower than a voltage reference of the cell. Also disclosed is a method of writing and restoring data stored in a ferroelectric memory cell.

17 Claims, 5 Drawing Sheets

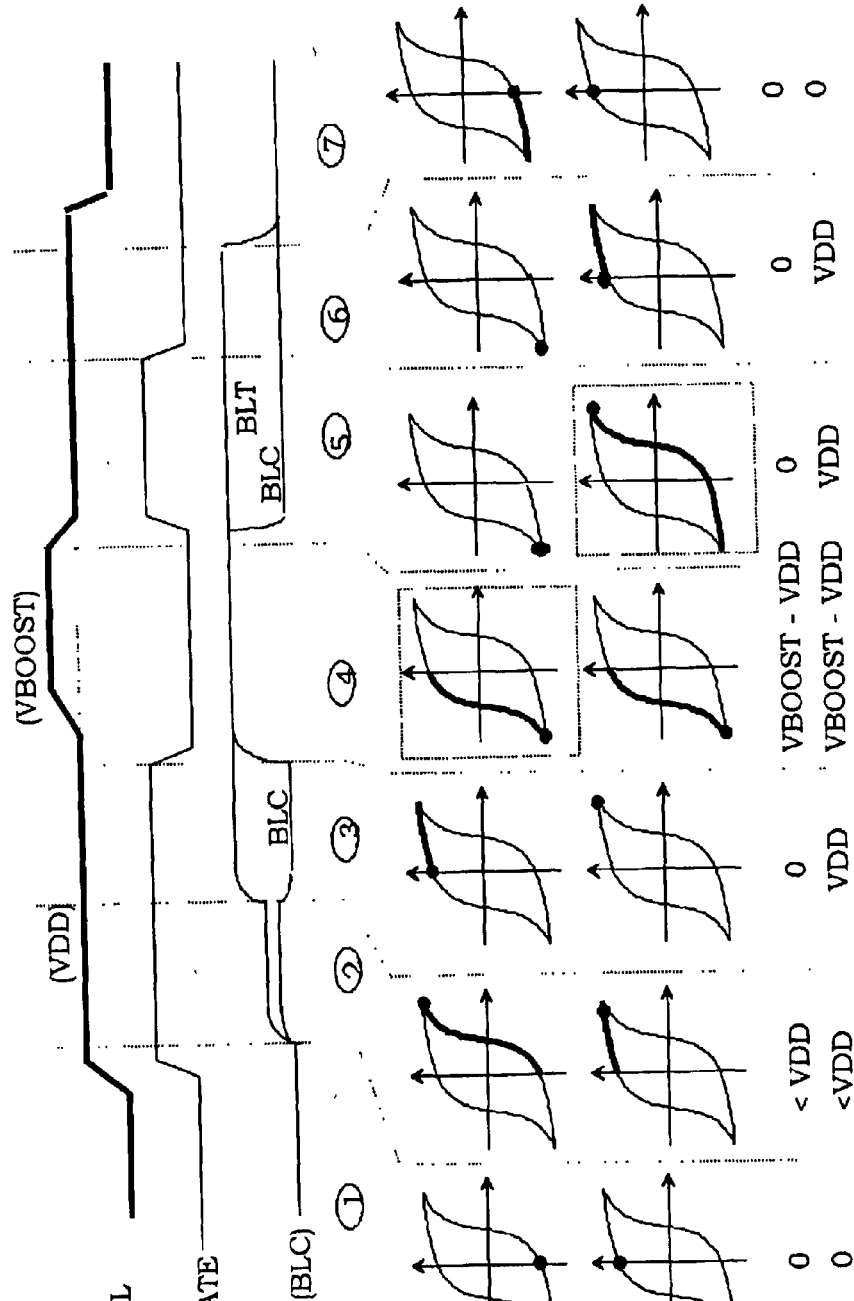

METHOD OF READING AND RESTORING DATA STORED IN A FERROELECTRIC MEMORY CELL

TECHNICAL FIELD OF APPLICATION

The present invention relates generally to data storage, and more specifically to a method of reading and restoring data stored in a ferroelectric memory cell.

BACKGROUND

As is well known, electronic memory devices of the non-volatile ferroelectric type integrated in a semiconductor comprise a plurality of non-volatile ferroelectric memory cells that are arranged into rows (wordlines) and columns (bitlines).

Each non-volatile ferroelectric memory cell comprises a MOS selection transistor and a ferroelectric capacitor. The capacitor may be connected to the selection transistor either in series or in parallel. The capacitor oxide is a ferroelectric layer capable of retaining a polarization which can be used to store any information.

If a strong electric field is applied across the capacitor, the polarization in the ferroelectric layer is in the same direction of the applied electric field and remains in that direction until the field is removed. Likewise, if the electric field is applied in the opposite direction, the polarization in the ferroelectric layer is reversed.

Accordingly, as the voltage varies across the capacitor, i.e., as the applied electric field varies, the charge stored on the capacitor follows a hysteretic pattern, as shown in FIG. 1.

For a ferroelectric material, one defines first and second polarization states, indicated as UP and DOWN in FIG. 1. Furthermore, a first logic value "0" can be associated with a low polarization state DOWN, and a second logic value "1" associated with a high polarization state UP, this being, of course, but one of two possibilities allowed. Thus, a non-volatile memory cell is obtained.

Two large families of non-volatile FeRAMs are currently in use, which are differentiated by the number of cells that are used for storing a single data bit.

The memory cells of a first family, known as 1T1C, comprise each a selection transistor that is connected in series with a ferroelectric capacitor.

This 1T1C family uses its single cell for storing one information bit. While being advantageous on several counts, the 1T1C family can only provide sensing signals of a limited amplitude.

Referring to FIG. 2, to obtain a large sensing signal, a second family of non-volatile memory cells, known as 2T2C, is used which is of the self-referenced architecture. A 2T2C cell 1 basically consists of two 1T1C memory cells. In particular, a first 1T1C cell 1a comprises a first selection transistor 2 connected in series with a ferroelectric capacitor 3.

The series of transistor 2 and capacitor 3 is connected between a first bitline BLT and an auxiliary line PLATE, which is shared by a predetermined number of cells. The control terminal of the selection transistor 2 is connected to a wordline WL.

The terminal that interconnects the transistor 2 and the ferroelectric capacitor 3 will be referred to as the bottom electrode BET hereinafter.

The memory cell 1 also includes a second 1T1C cell 1b comprising a second selection transistor 4 connected in series with a ferroelectric capacitor 5. This series is connected between a second bitline BLC and said auxiliary line PLATE. The control terminal of the selection transistor 4 in the second cell 1b is connected to the same wordline WL that is driving the selection transistor 2 in the first cell 1a.

The terminal that interconnects the transistor 4 and the ferroelectric capacitor 5 will be referred to as the bottom electrode BEC hereinafter.

It should be noted that the capacitors 3 and 5 are polarized in opposite directions at any time except while the cell 1 is being read/written.

By appropriate convention, either a logic 0 or a logic 1 can therefore be stored into the 2T2C cell 1.

A method of reading a 2T2C cell will now be described with reference to plots vs. time of the signals applied to the cell, and of the polarization conditions of the capacitors 3 and 5 when these signals change, as shown in FIGS. 3A and 3C.

For convenience of illustration, it will be assumed that the capacitor 3 connected to the bitline BLT is in a low (DOWN) state, and the capacitor 5 connected to the bitline BLC is in a high (UP) state.

The conventional reading method consists of steps as listed herein below.

Precharging Step 1

In this step, the bitlines BLC, BLT and the auxiliary line PLATE are connected to a low voltage reference (i.e. they are reset).

Read-Pulse Step 2

To apply a read pulse to the memory cell 1, the auxiliary line PLATE is pulsed to supply voltage VDD, thereby an electric field is applied across the capacitors 3 and 5.

Referring to FIG. 3B, the polarization of capacitor 3 changes, and produces a predetermined voltage V(BLT) on the bitline BLT due to an amount Qsw of charge having in the capacitor. Referring to FIG. 3C, the polarization of capacitor 5 does not change, and a voltage V(BLC) is produced on the bitline BLC due to an amount Qln of charge, with the voltage V(BLC) being lower than the voltage V(BLT) presented on bitline BLT.

Reading Step 3

Referring to FIG. 4, to actually read the memory cell 1, a conventional sense amplifier 7 is used which includes two inverters 8, 9 connected into a latching configuration between a first voltage reference VDD, e.g., the supply voltage, and a second voltage reference GND, e.g., the ground voltage, through respective PMOS and NMOS enable transistors M1 and M2. The inverter 8 comprises a series of PMOS and NMOS transistors 8a and 8b whose control terminals are connected together and to a common output node OUT of corresponding transistors 9a, 9b in the other inverter 9.

During the step of reading the memory cell 1, the sense amplifier 7 is switched on by application of a low-level signal SAP to the control terminal of the enable MOS transistor M1, and by application of a high-level signal SAN to the control terminal of the enable MOS transistor M2. This situation causes the voltage level V(BLT) to pull up the bitline BLT and the voltage level V(BLC) to pull down the bitline BLC, thereby enabling the sense amplifier 7 to read out data from the cell 1.

Restoring Step 4

This step is used to restore the capacitor 3 to its initial state. This is achieved by applying the supply voltage VDD to the bitline BLT and resetting the auxiliary line PLATE.

Referring to FIGS. 3B and 3C, it should be noted that the capacitor 5 would already be in its initial state, and both the bitline BLC and the auxiliary line PLATE reset.

Note is also made of that the data stored in the memory cell 1 is presented on the bitlines in digital form, at values that correspond to 0 and VDD, and can be output at any time during Steps 3 or 4.

Resetting Step 5

This step resets the whole circuit.

Thus, to read data from the 2T2C memory cell 1, an electric field is generated that pulls up the voltage value on the auxiliary line PLATE. As a result, both cells 1a and 1b are in the same state, the cell 1a that is to change its state (and accordingly referred to as the switch cell) being restored to its initial condition by application of an opposite electric field.

For this purpose, the signal on the auxiliary line PLATE is pulled down, while the voltage on bitline BLT is kept high and equal to the supply voltage reference VDD by the sense amplifier 7.

Although on several counts advantageous, the reading method just described has some drawbacks. In particular, to apply the real value of the voltage VDD to the common node BET between the transistor 2 and the capacitor 3 from the bitline BLT, the control terminal of the selection transistor 2, which is connected to the wordline WL, must be bootstrapped with a higher voltage VBOOT, which is equal to the supply voltage VDD plus the threshold voltage Vtn of an N-channel transistor (e.g., the transistor 2).

The wordline WL is also to be bootstrapped with a relatively high voltage in order to restore the cell 1 to its initial condition, as illustrated by the timing diagram in FIGS. 3A to 3C.

In practice, the operating voltage Vsat_ferro of the ferroelectric capacitor often happens to equal the supply voltage VDD, the latter also being the maximum operating voltage of the low-voltage transistors LV that comprise such memory cells. In particular, it is:

$$Vsat\_ferro = VDD = Vmaxlv$$

During Step 4 of restoring the switch cell 1a to its initial state, the voltage V(BLT) on the bitline BLT is equal to the supply voltage VDD, so that the voltage across the gate oxide of the transistor 2 is given as:

$$VBOOT - VDD = Vtn < Vmaxlv$$

During Step 4, however, the second cell 1b need not be restored to the initial state, and the voltage on the bitline BLC is zero. Therefore, the voltage across the gate oxide of the transistor 4 will be:

$$VBOOT > Vmaxlv$$

both during Reading Step 3 and Restoring Step 4.

It should be noted that the above considerations would also apply to the operation for writing a byte to an auxiliary line PLATE that comprises L bytes.

In particular, a prior writing method includes a starting operation for reading the L bytes, which comprises Precharging Step 1, Read-Pulse Step 2, and Reading Step 3 described hereinabove in connection with the reading method, followed by the step here below.

Writing Step 3b

This step of actually reading the data from the memory cell 1, is carried out by suitably driving the bitlines BLT and BLC, corresponding to the byte to be written, so that the new value of that byte can be stored up.

The prior writing method continues through Resetting Step 4 and Restoring Step 5, previously described for the conventional reading method.

It can be appreciated from the foregoing that in prior devices, the selection transistors 2, 4 must be MOS transistors that can accept high voltages at no breakdown of the oxide that would degrade their performance.

Such transistors are usually fabricated with a suitable oxide layer to withstand high voltages, but involve a complicated and expensive technology.

While the above read/restore cycle and write cycle have been described in connection with a memory cell of the 2T2C type, they would remain basically unchanged in the instance of a 1T1C memory cell, except that the read voltage is compared to a reference voltage.

Consequently, a method of reading/writing standard ferroelectric memory cells is needed, whereby the voltages applied to the transistors can be limited and the drawbacks of prior methods, and hence prior devices, overcome.

SUMMARY OF THE INVENTION

In one aspect of the invention, a ferroelectric memory cell read/restore cycle can limit the voltage drop across the selection transistors of the cell, in particular keep the voltage drop to within a maximum value that corresponds to the supply voltage reference of the cell.

In one example, a method of reading and restoring data that are stored in a ferroelectric memory cell includes:

a series of a first transistor with a first ferroelectric capacitor, connected between a first bitline and an auxiliary line;

a series of a second transistor with a second ferroelectric capacitor, connected between a second bitline and the auxiliary line;

said first and second transistors having respective control terminals connected to the same wordline; the reading method comprising the following steps:

precharging said first and second capacitors;

applying a read pulse to said cell such that the state of said first capacitor is changed;

reading said cell by a sensing means; and restoring said first capacitor to an initial state.

The features and advantages of the invention will become apparent from the following description of embodiments thereof, given by way of example and not of limitation with reference to the accompanying drawings.

BRIEF DESCRIPTION OF THE DRAWINGS

In the drawings:

FIG. 5A is a timing diagram of electric signals applied to the 2T2C ferroelectric memory of FIG. 2 through different steps of a method according to an embodiment of the invention;

FIG. 5B illustrates the polarization states of a first ferroelectric capacitor of the ferroelectric cell of FIG. 2 through different steps of a method according to an embodiment of the invention;

FIG. 5C illustrates the polarization states of a second ferroelectric capacitor of the ferroelectric cell of FIG. 2 through different steps of a method according to an embodiment of the invention;

DETAILED DESCRIPTION

Figure 1:
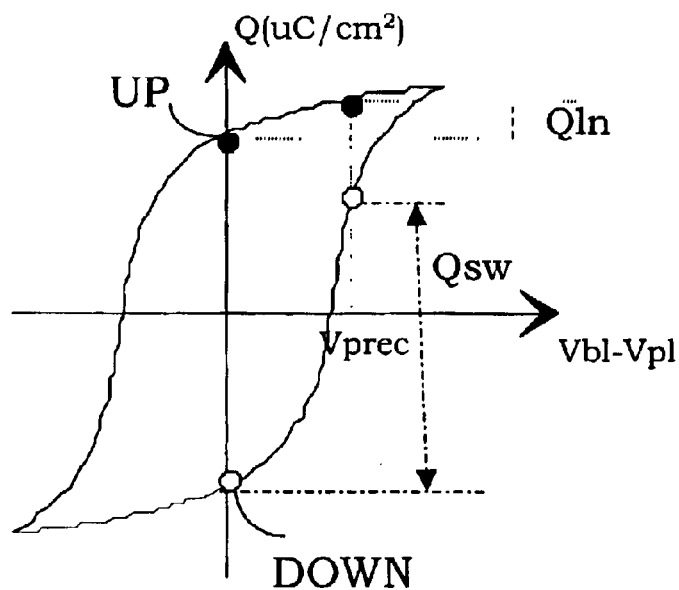
FIG. 1 illustrates the polarization states of a conventional ferroelectric capacitor as the voltage being applied to it varies.

With reference to the drawings, in particular to FIGS. 5A to 5C, a method of reading data stored in a ferroelectric memory cell will be described according to an embodiment of the invention. The embodiment will be described, by way of non-limitative example, in connection with a 2T2C type of memory cell similar to the conventional memory cell 1 previously described in conjunction with FIG. 2, like elements being denoted by the same reference numerals.

Figure 2:
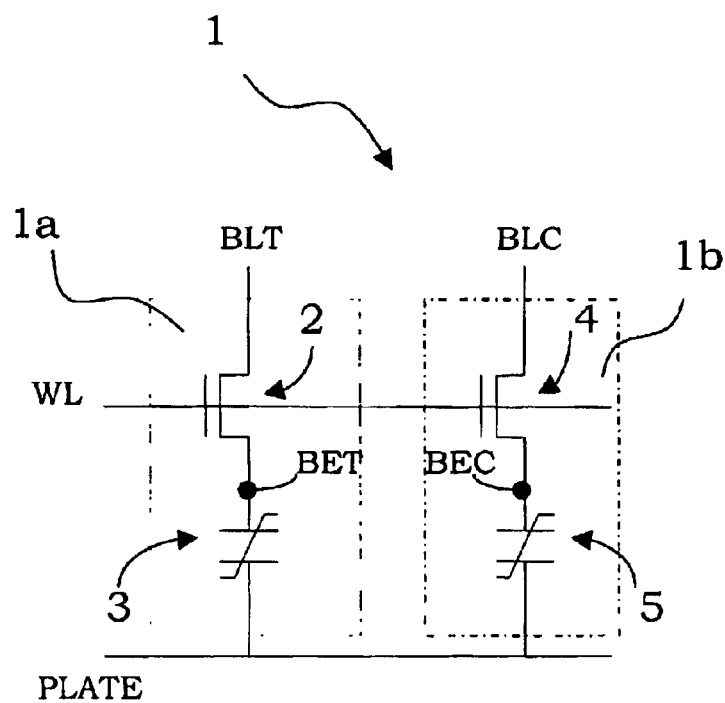
FIG. 2 is a schematic diagram of a conventional 2T2C ferroelectric memory cell.
Figures 3A, 3B, 3C:
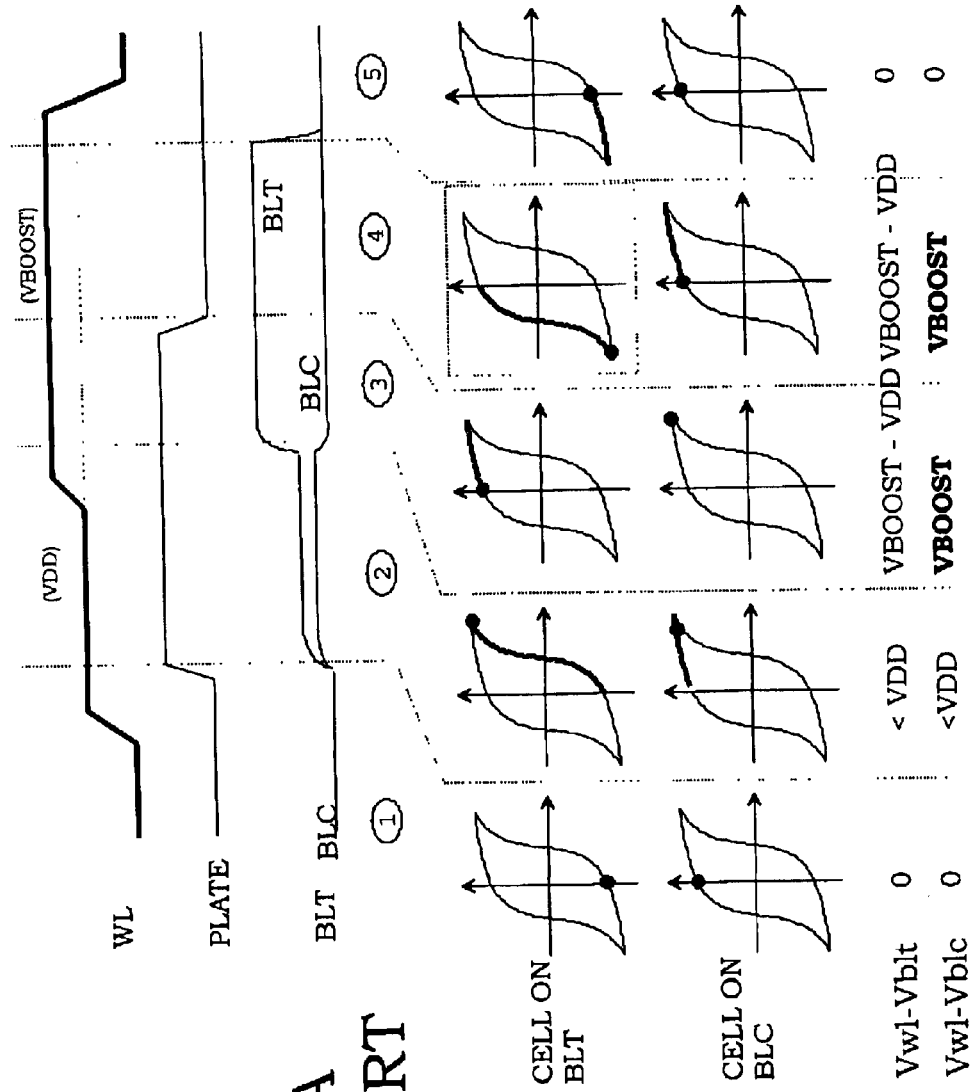
FIG. 3A is a timing diagram of electric signals conventionally applied to the 2T2C ferroelectric memory cell of FIG. 2.
FIG. 3B illustrates the polarization states of a first ferroelectric capacitor of the ferroelectric cell of FIG. 2.
FIG. 3C illustrates the polarization states of a second ferroelectric capacitor of the ferroelectric cell of FIG. 2.

Referring to FIG. 2, as in the conventional reading method described above, a starting condition is assumed in which a capacitor 3, connected to a bitline BLT, in a cell 1*a* is in a low state, and a capacitor 5, connected to a bitline BLC, in a cell 1*b* is in a high state.

The reading method of this embodiment comprises the steps described here below.

Precharging Step 1

Referring to FIG. 5A, the bitlines BLC, BLT and an auxiliary line PLATE are brought to a low state.

Read Pulse Step 2

Referring to FIGS. 5A–5C, a read pulse is applied to the cell 1, with the auxiliary line PLATE being pulled up to supply voltage VDD and an electric field being generated across the capacitors 3 and 5. As explained above, the polarization of capacitor 3 is changed, with a predetermined voltage V(BLT) being produced on the bitline BLT due to the amount Qsw of charge in the capacitor 3. The polarization of capacitor 5 remains unchanged, and a voltage is produced on bitline BLC due to the amount Qln of charge in the capacitor 5, which voltage is lower than the voltage V(BLT) on the bitline BLT.

Reading Step 3

Referring to FIGS. 4 and 5A–5C, a conventional sense amplifier 7 is used for reading the memory cell 1. The sense amplifier 7 includes two inverters 8, 9 in a latching configuration. These inverters are connected, in parallel with each other, between a voltage reference VDD and a voltage reference GND through PMOS and NMOS transistors M1 and M2, respectively.

During Reading Step 2, the sense amplifier 7 is switched on, with the signal SAP to transistor M1 connected to the supply voltage reference VDD being brought to a low, and the signal SAN to transistor M2 connected to the ground reference GND being brought to a high. This situation causes the voltage on bitline BLT to be increased and the voltage on bitline BLC decreased, so that the data stored in the memory cell 1 can now be read. At this time, the data to be read is in digital form (0-VDD) on the bitlines BLT, BLC, and must be stored into a suitable register, because bitline BLC is to be cleared for the next step. The read data stored into the register can be output as soon as Reading Step 3 is completed.

Advantageously, the reading method according to an embodiment of the invention further comprises the steps described here below.

Partial restoring Step 4

During this step, the bitline BLC is pulled up to supply voltage VDD. Thus, it is:

$$V(BLT)=V(BLC)=VDD$$

During this step, moreover, the wordline WL of the cells is pulled up to voltage VBOOT and the auxiliary line PLATE to ground GND.

Accordingly, both bitlines BLT and BLC will be at supply voltage VDD, and the highest voltage across the gates of the transistors 2 and 4 will advantageously be equal to VBOOST–VDD.

During this part-restoring step, capacitor 3 is restored to its initial condition, but capacitor 5 will no longer be in its initial state.

Further Restoring Step 5

During this step, the wordline WL is discharged down to supply voltage VDD. The bitline BLC is grounded, and the auxiliary line PLATE is pulled up to supply voltage VDD. Thus, capacitor 5 is also restored to its initial state.

Figures 6A, 6B:
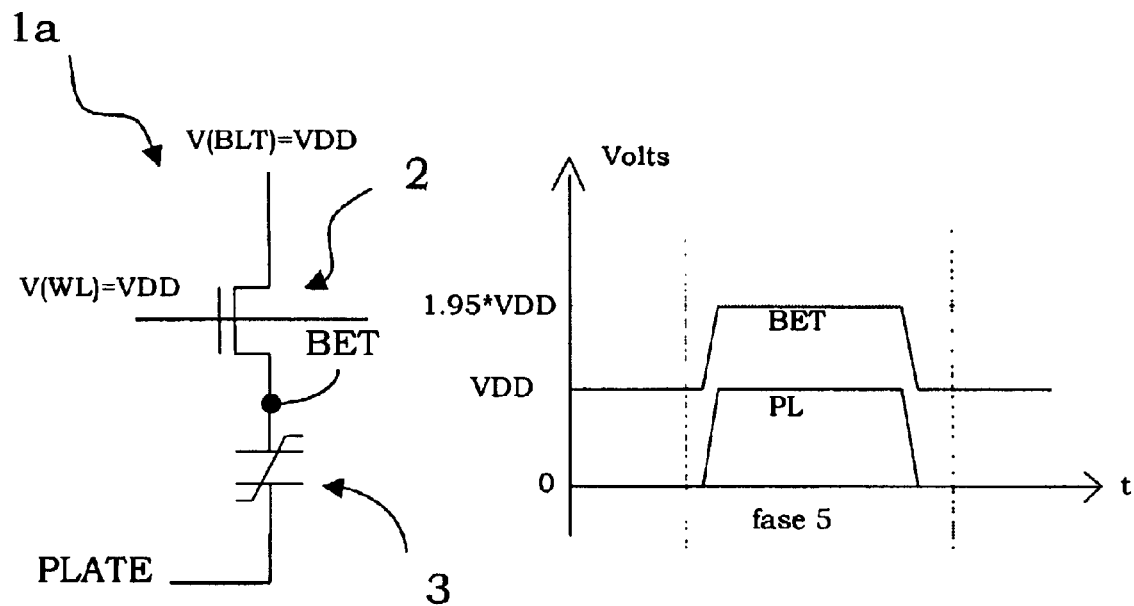
FIG. 6A is a detail view of a ferroelectric cell of FIG. 2 at one step of a method according to an embodiment of the invention.
FIG. 6B is a diagram of internal signals of the cell of FIG. 6A.
Figure 4:
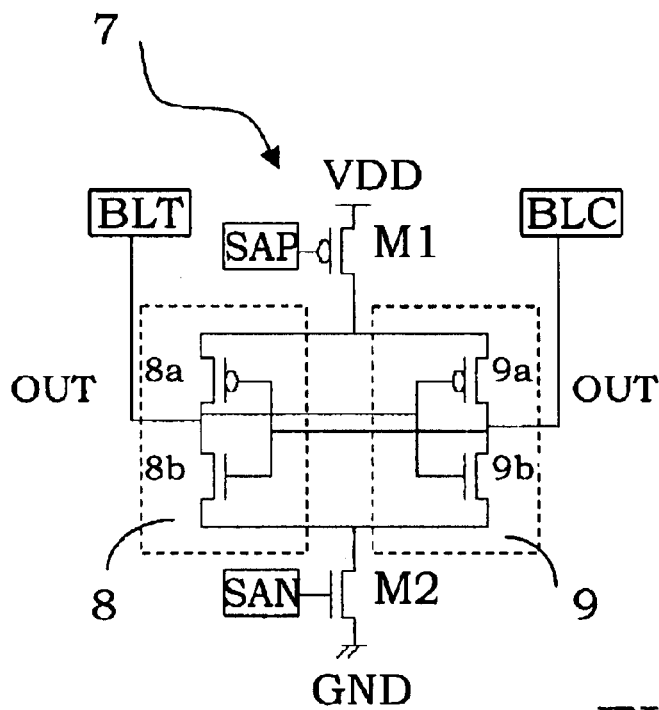
FIG. 4 is a schematic diagram of a conventional sense amplifier.

During this step, the selection transistor 2 is switched "off" because its gate voltage equals the voltage at the conduction terminals, i.e., the supply voltage VDD. Consequently, the node BET of capacitor 3 is floating, its voltage being equal to the supply voltage VDD plus the partitioning of the read pulse to the auxiliary line PLATE between the ferroelectric capacitor 3 (e.g., 20 fF) and the parasitic capacitance of the selection transistor 2 (e.g., 1 fF), as shown schematically in FIG. 6A. Considering the above values, the voltage drop across the ferroelectric capacitor 3 is always equal the supply voltage VDD, so that the pulse on the auxiliary line PLATE has no effect with respect to the discharging step of conventional methods, this being shown schematically in FIG. 6B.

The embodiment of the invention further comprises the steps described here below.

Step 6 of Resetting Auxiliary Line PLATE and Bitline BLT

The auxiliary line PLATE and bitline BLT are grounded.

Step 7 of Resetting Wordline WL

The wordline WL is also grounded.

The cycle just described allows a 2T2C cell to be read and restored to its initial state by application of the supply voltage VDD to the ferroelectric capacitor, but with a voltage drop across the selection transistor that has VDD as its maximum.

While an embodiment of the reading method of the invention has been described as applied to a 2T2C access cycle, it will be appreciated that it could be applied to 1T1C memory cells as well.

In the latter instance, the capacitors 3, 5 would be used for storing one bit in each of them. Furthermore, the sensing circuit would differ in that it works to compare the bitline voltage to a reference voltage.

To summarize, the reading method according to an embodiment of this invention comprises the following steps:
precharging the cell capacitors;
applying a read pulse to the cell in order to change the state of one of the capacitors;
actually reading the cell;
restoring the first capacitor to its starting state by causing both capacitors to change their states, such that the voltage across the selection transistors will not exceed a voltage VBOOT−VDD; and
restoring the second capacitor to the initial or starting state.

Advantageously, by using this reading method, ferroelectric memory cells can be produced which only comprise low-voltage transistors. Thus, the memory cells can be integrated to low-voltage processes, and the technological and economical bounds of conventional devices overcome.

Figure 7:
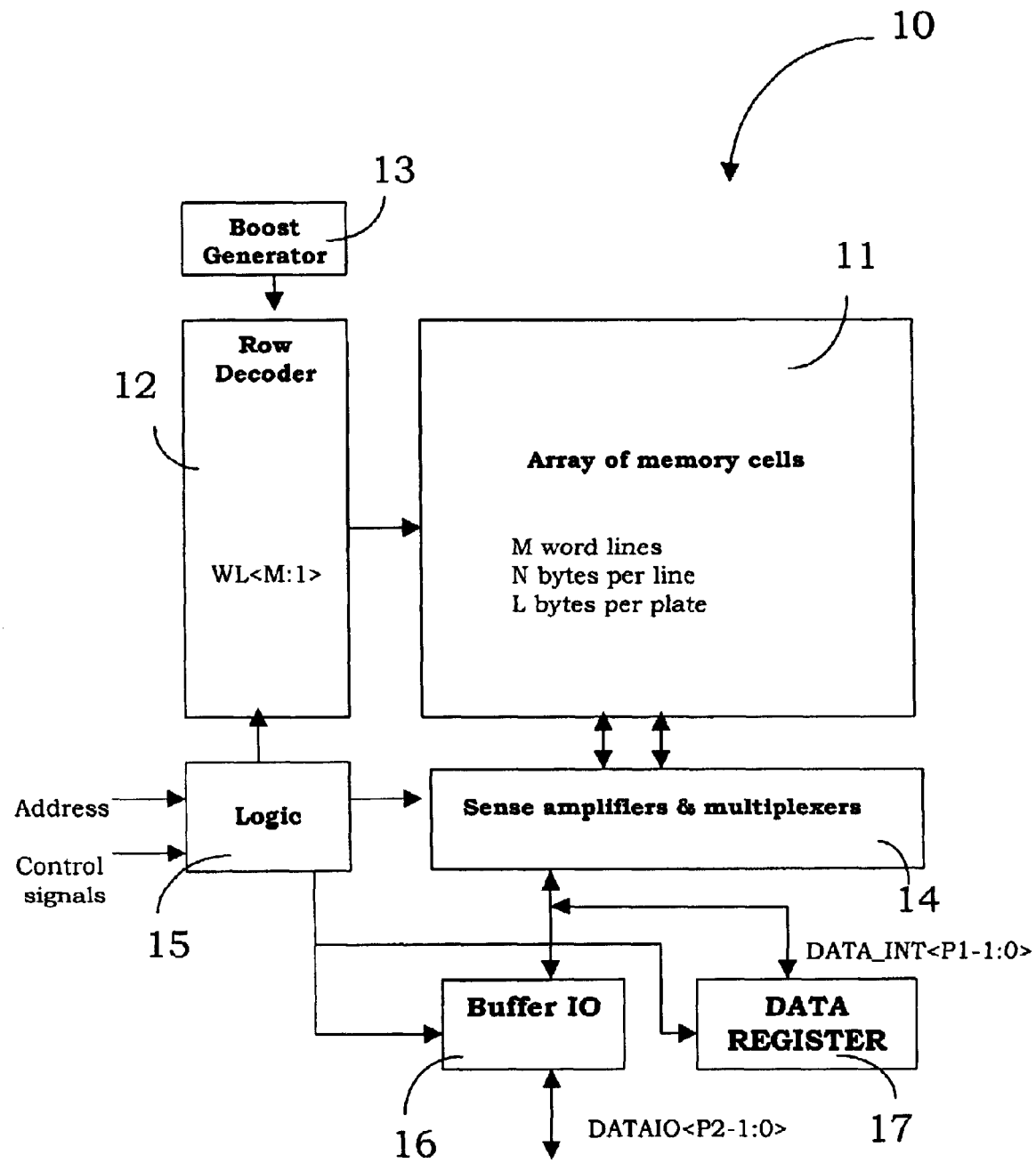
FIG. 7 illustrates schematically a reading system that implements a method according to an embodiment of the invention.

The above-described reading method can be implemented on a reading system, as shown schematically at 10 in FIG. 7.

The reading system 10 includes a memory array 11 comprising M lines of N bytes arranged as L bytes per auxiliary line PLATE. By providing the auxiliary lines PLATE, power usage and the number of program/erase cycles that the cells are to undergo can be reduced. In particular, it is known to break the auxiliary line PLATE along the wordline of the memory array 11 with additional decoding.

The number P0 of auxiliary lines PLATE per row is given as:

$$P0=N/L$$

where, N is the number of bytes per row, and L is the number of bytes per auxiliary line Plate.

Alternatively, there could be only one auxiliary line PLATE and N=L.

The reading system 10 further includes a row decoder 12 adapted to apply voltage values to the wordlines which are equal to the supply voltage VDD and to a bootstrapped voltage Vboost from a boost generator 13, the latter being connected to the row decoder 12. Alternatively, a boost generator 13 could be integrated to the row decoder 12 for optimum overall performance and area occupation.

Connected to the memory array 11 are also NSA sense amplifiers and writing devices (multiplexers), it being NSA= 8*N, as shown generally at 14. The amplifiers 14 are driven from suitable control logic 15, which is further connected to the row decoder 12 and is input suitable control signals.

Advantageously in this embodiment of the invention, the control logic 15 will handle all the operations in the reading system 10.

An internal data bus DATA_INT connects a plurality of input/output (IO) buffers 16 to the amplifiers 14 and their multiplexers via a data register 17.

Advantageously, the data register 17 is adapted to store up the data read during Reading Step 3 for re-use during Further Restoring Step 5.

An external data bus DATAIO will eventually convey the data provided by the amplifiers 14 to the outside world.

It should be noted that the internal data bus DATA_INT and the external data bus DATAIO would be the same size in conventional reading systems, since the restoring operation does not involve the internal data bus DATA_INT. On the contrary, in the data reading and restoring method of this embodiment of the invention, the internal bus DATA_INT is involved in the reading and restoring operations, and its preferred size P1=8*L. The P1 value is also the number of bits that are stored into the register 17. Also, the size of the external bus DATAIO is smaller than that, P1, of the internal bus DATA_INT.

To sum up, the reading system 10 that implements a reading method according to an embodiment of this invention can be described by the following sequence of steps:
reading L bytes by means of the sense amplifiers 14;
copying the bytes read to the data register 17 by means of the multiplexers and amplifiers 14; and
in parallel with the restoration procedure, outputting the addressed byte from the L-byte register 17 by means of another multiplexer (not shown because conventional, but preferably integrated into the register 17).

Using the memory cell read/restore cycle that effectively limits the voltage drop across the cell selection transistors, as discussed above, a method of writing a ferroelectric memory cell is also provided that has the same advantages.

In particular, a writing method according to an embodiment of the invention first consists of an operation for reading the L bytes from the auxiliary line PLATE, this operation comprising Precharging Step 1, Read-Pulse Step 2, and Actual Reading Step 3 as previously described in relation to the reading method. The operation for reading the L bytes further comprises storing the L bytes into the data register 17.

In addition, the writing method according to an embodiment of the invention comprises Partial restoring Step 4, followed by:
Write-in Step 4b During this step, the byte data to be written, as preliminarily loaded into register 17, is written into the memory cell 1 by driving the bitlines BLC and BLT.

The writing method then continues through Further Restoring Step 5, Step 6 of Resetting Auxiliary Line PLATE and Bitline BLT, and Step 7 of Resetting Wordline WL previously described in relation to the reading method.

This writing method may be implemented on a writing system similar to the system 10 shown schematically in FIG. 7, wherein the register 17 stores the data to be written in.

Alternatively, the writing step can replace the storing step 5. For example, suppose one wanted to write an opposite state (from that shown in FIGS. 5A–5C) to the cell 1 of FIG. 2. Then, during step 5, he would reverse the voltages on BLC and BLT, such that BLT is low and BLC is high (VDD), so that the capacitor 3 is in an UP state and the capacitor 5 is in a DOWN state.

From the foregoing it will be appreciated that, although specific embodiments of the invention have been described herein for purposes of illustration, various modifications may be made without deviating from the spirit and scope of the invention.

What is claimed is:

1. A method of reading and restoring data stored in a ferroelectric memory cell, which cell comprises:
a first transistor and first ferroelectric capacitor connected, in series with each other, between a first bitline and an auxiliary line;
a second transistor and second ferroelectric capacitor connected, in series with each other, between a second bitline and the auxiliary line;
said first and second transistors having respective control terminals connected to a common wordline; the reading method comprising the following steps:

precharging said first and second capacitors;

applying a read pulse to said cell such that the state of said first capacitor is changed;

reading said cell by a sensing means; and restoring said first capacitor to an initial state;

the reading method being characterized in that it further comprises the steps of:

changing the state of said second capacitor during said step of restoring said first capacitor, and further restoring said second capacitor to an initial state, such that the voltages being applied to said transistors during any of said steps are lower than a voltage reference of said cell.

2. The method of reading according to claim 1, characterized in that, during both said steps of applying said read pulse and restoring said second capacitor, said wordline and said auxiliary line are pulled up to said first voltage reference.

3. The method of reading according to claim 1, characterized in that, during said step of changing the state of said second capacitor, said auxiliary line is pulled down to a second voltage reference, and said wordline brought to a third voltage reference higher than said first voltage reference.

4. The method of reading according to claim 1, characterized in that, during said step of restoring said capacitors, the same signal is applied to said first bitline as to said second bitline, and said auxiliary line is reset.

5. The method of reading according to claim 1, characterized in that at least one of said first and second transistors is a low-voltage transistor.

6. The method of reading according to claim 5, characterized in that it comprises storing data that have been read during said reading step for re-use in subsequent steps of partly restoring and further restoring said capacitors to starting conditions.

7. A method of writing data into a ferroelectric memory cell, which cell comprises:

a first transistor and first ferroelectric capacitor connected, in series with each other, between a first bitline and an auxiliary line;

a second transistor and second ferroelectric capacitor connected, in series with each other, between a second bitline and the auxiliary line;

said first and second transistors having respective control terminals connected to a common wordline; the writing method comprising the following steps:

precharging said first and second capacitors;

applying a read pulse to said cell such that the state of said first capacitor (3) is changed;

reading said cell by a sensing means;

restoring said first capacitor to an initial state; and writing data to be written into said memory cell by driving said first and second bitlines;

the writing method being characterized in that it further comprises, before said writing step, a step of changing the state of said second capacitor during said step of restoring said first capacitor, and after said writing step, a step of further restoring said second capacitor to an initial state, such that the voltages being applied to said transistors during any of said steps are lower than a voltage reference of said cell.

8. The method of writing according to claim 7, characterized in that, during both said steps of applying said read pulse and restoring said second capacitor, said wordline and said auxiliary line are pulled up to said first voltage reference.

9. The method of writing according to claim 7, characterized in that, during said step of changing the state of said second capacitor, said auxiliary line is pulled down to a second voltage reference, and said wordline pulled up to a third voltage reference higher than said first voltage reference.

10. The method of writing according to claim 7, characterized in that, during said step of restoring said capacitors, the same signal is applied to said first bitline as to said second bitline, and said auxiliary line is reset.

11. The method of writing according to claim 7, characterized in that at least one of said first and second transistors is a low-voltage transistor.

12. The method of writing according to claim 11, characterized in that it comprises storing up said data to be written.

13. A method of reading and writing data in a ferroelectric memory having source of supply voltage VDD and a source of voltage VBoost greater than the supply voltage VDD all with respect to a ground reference, at least one cell having at least a first storage capacitor and a first transistor connected to receive state switching and sensing on a word line, auxillary line, and a first bitline, comprising a sequence of reading and restoration steps including:

a read step wherein voltages of VDD are applied to the word line and auxiliary line and a state of the storage capacitor is sensed at the first bitline;

a partial restoration step for the state of charge on the first capacitor wherein a voltage VBoost is applied to the word line concurrently with the bitline being pulled to the supply voltage VDD such that during this step the maximum voltage across the first transistor is VBoost−VDD; and a further restoration step for the state of charge on the capacitor wherein the word line is lowered to the level of the supply voltage VDD, the first bitline is lowered to ground reference, and the auxiliary line is raised to the level of the supply voltage such that during this step the maximum voltage across the first transistor is VDD.

14. The method of reading and writing data in a ferroelectric memory according to claim 13, wherein each cell of the memory is a 2T2C cell having a second storage capacitor and a second transistor and first and second bitlines and the steps of reading, partial restoration and further restoration are characterized by limiting the maximum voltage across each of the first and second transistors to the supply voltage VDD.

15. The method of reading and writing data in a ferroelectric memory according to claim 14, wherein during the step of partial restoration both bitlines are pulled up to the level of the supply voltage VDD such that maximum voltage across each of the first and second transistors during this step of partial restoration is VBOOST−VDD.

16. The method of reading and writing data in a ferroelectric memory according to claim 13, wherein the memory is a 1T1C memory.

17. The method of reading and writing data in a ferroelectric memory according to claim 13, wherein the first transistor is of the relatively low-voltage class having a maximum reliable voltage capability before breakdown of about the supply voltage VDD.

* * * * *